(12) United States Patent
Bai et al.

(10) Patent No.: US 9,793,325 B2
(45) Date of Patent: Oct. 17, 2017

(54) OLED DISPLAY PANEL AND THE METHOD FOR FABRICATING THE SAME, AND OLED DISPLAY APPARATUS

(71) Applicants: BOE TECHNOLOGY GROUP CO., LTD., Beijing (CN); ORDOS YUANSHENG OPTOELECTRONICS CO., LTD., Ordos, Inner Mongolia (CN)

(72) Inventors: Juanjuan Bai, Beijing (CN); Weilin Lai, Beijing (CN); Minghua Xuan, Beijing (CN); Fengli Ji, Beijing (CN); Haidong Wu, Beijing (CN); Shanshan Bai, Beijing (CN)

(73) Assignees: BOE TECHNOLOGY GROUP CO., LTD., Beijing (CN); ORDOS YUANSHENG OPTOELECTRONICS CO., LTD., Ordos, Inner Mongolia (CN)

( * ) Notice: Subject to any disclaimer, the term of this patent is extended or adjusted under 35 U.S.C. 154(b) by 0 days.

(21) Appl. No.: 15/104,498

(22) PCT Filed: Oct. 19, 2015

(86) PCT No.: PCT/CN2015/092208
§ 371 (c)(1),
(2) Date: Jun. 14, 2016

(87) PCT Pub. No.: WO2016/197503
PCT Pub. Date: Dec. 15, 2016

(65) Prior Publication Data
US 2016/0358981 A1 Dec. 8, 2016

(30) Foreign Application Priority Data
Jun. 8, 2015 (CN) .......................... 2015 1 0310651

(51) Int. Cl.
*H01F 27/32* (2006.01)
*H01L 27/32* (2006.01)
(Continued)

(52) U.S. Cl.
CPC .......... *H01L 27/3213* (2013.01); *G02B 5/201* (2013.01); *H01L 27/322* (2013.01);
(Continued)

(58) Field of Classification Search
CPC ... H01L 27/3213; H01L 27/322; H01L 51/56; H01L 33/00; H01L 33/50; H01L 25/075;
(Continued)

(56) References Cited

U.S. PATENT DOCUMENTS 8,400,587 B2   3/2013   Woo et al.
9,318,033 B2   4/2016   Matsui et al.
(Continued)

FOREIGN PATENT DOCUMENTS

CN   104103672 A   10/2014
CN   104900679 A   9/2015
(Continued)

OTHER PUBLICATIONS

China Office Action, Application No. 201510310651.5, dated May 17, 2017, 14 pps.: with English Translation.

*Primary Examiner* — Joseph L Williams
*Assistant Examiner* — Jose M Diaz
(74) *Attorney, Agent, or Firm* — Armstrong Teasdale LLP (57) ABSTRACT

The present disclosure provides an OLED display panel and a method for fabricating the same and an OLED display apparatus. The OLED display panel includes a light-emitting layer, the light-emitting layer includes white sub-pixels and color sub-pixels, the size of the white sub-pixel is equal to the sum of size of at least two of the color sub-pixels, and the number of the color sub-pixels is less than the number of
(Continued)

color-forming primary colors. The OLED display panel further includes a color film, the color film including color blocks matching the color sub-pixels, the color blocks being disposed on a side of the light-emitting layer toward the display side and at positions corresponding to the positions where the white sub-pixels are located.

16 Claims, 4 Drawing Sheets

(51) Int. Cl.
*H05B 33/14* (2006.01)
*G02B 5/20* (2006.01)
*H01L 51/56* (2006.01)
*H01L 51/00* (2006.01)
*H01L 51/50* (2006.01)

(52) U.S. Cl.
CPC ...... *H01L 27/3216* (2013.01); *H01L 51/0011* (2013.01); *H01L 51/56* (2013.01); *H05B 33/145* (2013.01); *H01L 51/5012* (2013.01)

(58) Field of Classification Search
CPC ............ H01L 25/0753; H01L 25/0756; H01L 25/048; H01L 27/15; H01L 27/3244; H01L 27/3281; H01L 27/3202; H01L 27/3204; H01L 51/5203; H01L 51/50; H01L 51/504; H01L 51/5064; H01L 51/508; H01L 51/5278; H01L 27/3216; H01L 51/5012; H01L 51/0022; F21K 9/56; F21K 2099/005; C09K 11/02; C09K 11/06; C09K 11/08; H05B 33/0803; H05B 33/06; H05B 33/08; H05B 33/145; G02B 5/201
See application file for complete search history.

(56) References Cited

U.S. PATENT DOCUMENTS

| | | | |
|---|---|---|---|
| 9,439,263 B2 * | 9/2016 | Yang | G09G 3/2003 |
| 9,478,770 B2 * | 10/2016 | Kim | H01L 51/5203 |
| 2015/0116375 A1 * | 4/2015 | Yang | G09G 3/2003 |
| | | | 345/690 |
| 2015/0140493 A1 * | 5/2015 | Enomoto | C07D 317/22 |
| | | | 430/322 |
| 2015/0311261 A1 * | 10/2015 | Choi | H01L 27/322 |
| | | | 257/40 |
| 2016/0197104 A1 * | 7/2016 | Kim | H01L 27/1251 |
| | | | 257/347 |
| 2016/0322000 A1 * | 11/2016 | Kim | G09G 3/2003 |

FOREIGN PATENT DOCUMENTS

| | | | | |
|---|---|---|---|---|
| JP | 2016102935 A | * | 6/2016 | ......... H01L 27/3216 |
| WO | 2014121559 A1 | | 8/2014 | |

* cited by examiner

OLED DISPLAY PANEL AND THE METHOD FOR FABRICATING THE SAME, AND OLED DISPLAY APPARATUS

CROSS REFERENCE TO RELATED APPLICATIONS

The present application is a National Stage Entry of PCT/CN2015/092208 filed Oct. 19, 2015, which claims the benefit and priority of Chinese patent application No. 201510310651.5 filed on Jun. 8, 2015, both of which are incorporated herein by reference in their entirety.

BACKGROUND

The disclosure relates to an OLED display panel and its fabricating method, and an OLED display apparatus.

Organic Light-Emitting Diode (OLED) display panel, also known as Organic electroluminescent display panel, due to its high brightness, low power consumption, high contrast, fast response, is widely used by academia and industry, and is considered to be the next generation of new display technology which can replace LCD.

An OLED display panel includes a front substrate, a rear substrate, and an anode layer, a light-emitting layer and a cathode layer disposed sequentially between the front substrate and the rear substrate, wherein the light-emitting layer includes red sub-pixel (R), green sub-pixel (G) and blue sub-pixel (B), and the voltage between the anode layer and the cathode layer corresponding to R, G and B is controlled according to a formulation, so that R, G and B emit red light, green light and blue light with respective brightness (three primary colors), to form a desired color.

In practice, for the fabrication of a light-emitting layer of the above OLED display panel, it requires the use of Fine Metal Mask (hereinafter referred to FMM MASK) evaporation process three times to evaporate R, G and B respectively. Further, in order to ensure the resolution, the aperture ratio of FMM MASK at each evaporation process is generally limited to less than 300 ppi, or even, in order to further improve the resolution, the aperture ratio of FMM MASK should be further reduced, the so-called aperture ratio of FMM MASK referring to, for each sub-pixel, the ratio of area through which light can pass of the MASK (i.e., area of the aperture) to the total area.

However, it is found in practical applications that the low aperture ratio of FMM MASK easily leads to blocked FMM MASK aperture in the evaporation process, and results in line defects and color mixing on the OLED display panel with poor quality.

BRIEF DESCRIPTION

The present disclosure aims to solve at least one of the technical problems in the field, and proposes an OLED display panel and its fabricating method, an OLED display apparatus.

Embodiments of the present disclosure provide an OLED display panel including a light-emitting layer; the light-emitting layer comprising white sub-pixels and color sub-pixels, a size of the white sub-pixel being equal to the sum of size of at least two color sub-pixels, the number of the color sub-pixels being less than the number of color-forming primary colors. The OLED display panel further includes a color film, the color film including color blocks matching the color sub-pixels, the color blocks being disposed on a side of the light-emitting layer toward the display side and at positions corresponding to the positions where the white sub-pixels are located.

Further, the color sub-pixels include red sub-pixels, green sub-pixels and blue sub-pixels, the light-emitting layer includes one kind of color sub-pixel of the color sub-pixels, and the one kind of color sub-pixel is the green sub-pixels, each row of the light-emitting layer is arranged in a way that the white sub-pixels and the green sub-pixels are disposed at intervals, the size of each of the white sub-pixels is equal to the sum of size of one of the red sub-pixels, one of the green sub-pixels and one of the blue sub-pixels, corresponding to each of the white sub-pixels in one row, the color film includes three kinds of the color blocks, and the color blocks are disposed in the row direction in the order of red block, green block and blue block, or blue block, green block and red block.

Further, the color sub-pixels include red sub-pixels, green sub-pixels and blue sub-pixels, the light-emitting layer includes one kind of color sub-pixel of the color sub-pixels, and the one kind of color sub-pixel is the blue sub-pixels, each row of the light-emitting layer is arranged in a way that the white sub-pixels and the blue sub-pixels are disposed at intervals, the size of each of the white sub-pixels is equal to the sum of size of two of the green sub-pixels and one of the red sub-pixels, corresponding to each of the white sub-pixels in one row, the color film includes two kinds of the color blocks, and the color blocks are disposed in the row direction in the order of green block, red block and green block.

Further, the color sub-pixels include red sub-pixels, green sub-pixels and blue sub-pixels, the light-emitting layer includes one kind of color sub-pixel of the color sub-pixels, and the one kind of color sub-pixel is the red sub-pixels, each row of the light-emitting layer is arranged in a way that the white sub-pixels and the red sub-pixels are disposed at intervals, the size of each of the white sub-pixels is equal to the sum of size of two of the green sub-pixels and one of the blue sub-pixels, corresponding to each of the white sub-pixels in one row, the color film includes two kinds of the color blocks, and the color blocks are disposed in the row direction in the order of green block, blue block and green block.

Further, the color sub-pixels include red sub-pixels, green sub-pixels and blue sub-pixels, the light-emitting layer includes two kinds of color sub-pixel of the color sub-pixels, and the two kinds of color sub-pixel are arranged consecutively and are the green sub-pixels and the blue sub-pixels, each row of the light-emitting layer is arranged in a way that the white sub-pixels and the two kinds of color sub-pixels arranged consecutively are disposed at intervals, the size of each of the white sub-pixels is equal to the sum of size of one of the green sub-pixels and one of the blue sub-pixels, corresponding to each of the white sub-pixels in one row, the color film includes two kinds of the color blocks, and if the two kinds of color sub-pixels arranged consecutively are disposed in the row direction in the order of blue sub-pixel and green sub-pixel, the two kinds of the color blocks are disposed in the row direction in the order of red block and green block, if the two kinds of color sub-pixels arranged consecutively are disposed in the row direction in the order of green block and blue block, the two kinds of the color blocks are disposed in the row direction in the order of green block and red block.

In particular, the color sub-pixels include red sub-pixels, green sub-pixels and blue sub-pixels, the light-emitting layer includes two kinds of color sub-pixel of the color sub-pixels, and the two kinds of color sub-pixel are arranged consecutively and are the green sub-pixels and the red sub-pixels, each row of the light-emitting layer is arranged in a way that the white sub-pixels and the two kinds of color sub-pixels arranged consecutively are disposed at intervals, the size of each of the white sub-pixels is equal to the sum of size of one of the green sub-pixels and one of the red sub-pixels, corresponding to each of the white sub-pixels in one row, the color film includes two kinds of the color blocks, and if the two kinds of color sub-pixels arranged consecutively are disposed in the row direction in the order of red sub-pixel and green sub-pixel, the two kinds of the color blocks are disposed in the row direction in the order of blue block and green block, if the two kinds of color sub-pixels arranged consecutively are disposed in the row direction in the order of green block and red block, the two kinds of the color blocks are disposed in the row direction in the order of green block and blue block.

Further, the white sub-pixels and the same kind of the color sub-pixels in neighboring rows of the light-emitting layer correspond to each other one-to-one in position.

Embodiments of the present disclosure further provide an OLED display apparatus including an OLED display panel, the display panel employing the OLED display panel provided by the technical solution.

Embodiments of the present disclosure also provide a method for fabricating an OLED display panel, the method including at least the following steps: fabricating one of a light-emitting layer and a color film, wherein the light-emitting layer includes color sub-pixels and white sub-pixels, a size of the white sub-pixel is equal to the sum of size of at least two color sub-pixels, and the number of the color sub-pixels is less than the number of color-forming primary colors, the color film including color blocks matching the color sub-pixels, according to the one of the light-emitting layer and the color film fabricated in advance and according to a corresponding position relationship between the color blocks and the white sub-pixels, fabricating the other of the light-emitting layer and the color film and depositing the color film on a side toward the display side and the light-emitting layer on a side back toward the display side.

Further, a mask evaporation process is used to evaporate the white sub-pixels and color sub-pixels of the light-emitting layer.

Further, a mask in the mask evaporation process adopts a striped mask pattern or a dotted mask pattern.

The OLED display panel provided in the embodiments of the present disclosure, by means of the white sub-pixel of the light-emitting layer in combination with the color blocks of the color film, forms one kind of color sub-pixels, and achieves the display together with the color sub-pixels of the light-emitting layer itself. Since the size of white sub-pixel of the light-emitting layer is equal to the size of at least two color sub-pixels, when the mask evaporation process is used to evaporate the white sub-pixels, the minimum aperture size of the mask thereof is the size of two color sub-pixels. The size of each kind of the color sub-pixels of the present disclosure is the same as the size of each kind of color sub-pixels in the prior art. Whereby compared with the prior art in which the aperture size of the mask is set merely as the size of one color sub-pixel for fabrication of the light-emitting layer, with the OLED display panel provided in the embodiments of the present disclosure, the phenomenon that due to a small size the aperture of the mask in the evaporation process is blocked may be improved, thereby reducing the possibility of occurrence of line defects and color mixing on the OLED display panel and improving the quality of the OLED display panel. Further, if the light-emitting layer includes one kind of color sub-pixels and white sub-pixel, then the mask evaporation process is only required twice, one time less than the three times of mask evaporation process required in the prior art, not only to increase productivity, thereby improving economic benefits, but also to reduce the risk of color mixing and the like caused by the misalignment of the mask apertures in the mask evaporation process, thereby improving the quality of the OLED display panel.

The OLED display apparatus according to the embodiment of the present disclosure employing the OLED display panel according to the embodiment of the present disclosure, can not only improve the quality of the OLED display panel, but also improve production efficiency, thereby improving economic benefits.

According to the method of manufacturing the OLED display panel according to the embodiment of the present disclosure, due to fabrication of the white sub-pixel whose size is the sum of size of at least two color sub-pixels, the aperture size of mask in the mask evaporation process corresponds to the sum of size of at least two color sub-pixels, compared with the prior art which requires that the mask aperture size is merely the size of one color sub-pixel, the phenomenon that due to a small size the aperture of mask in the evaporation process is blocked can be improved, thereby reducing the possibility of occurrence of line defects and color mixing on the OLED display panel and improving the quality of the OLED display panel. In addition, if a light-emitting layer with one kind of color sub-pixels and white sub-pixel is fabricated, the mask evaporation process is required only twice, one time less than the three times of mask evaporation process which is required in the prior art, not only to increase productivity, thereby improving economic benefits, but also to reduce the risk of color mixing and the like caused by the misalignment of the mask apertures in the mask evaporation process, thereby improving the quality of the OLED display panel.

BRIEF DESCRIPTION OF THE DRAWINGS

To more clearly illustrate the technical solution of the disclosure, accompanying drawings to be used in the description will be briefly described below. Apparently, the accompanying drawings in the following description are merely for some embodiments of the present disclosure. From these drawings, those of ordinary skill in the art may also obtain other drawings without creative efforts.

DETAILED DESCRIPTION

To make those skilled in the art better understand the technical solution of the present disclosure, the OLED display panel and the method for manufacturing the same, the OLED display apparatus provided in the present disclosure are described below in detail in combination with the accompanying drawings. Obviously, the embodiments described are merely part of, instead of all of, embodiments of the present disclosure. All other embodiments obtained by those of ordinary skill based on the embodiments of the present disclosure without creative efforts fall within the scope of protection of the present disclosure.

Figure 1A:
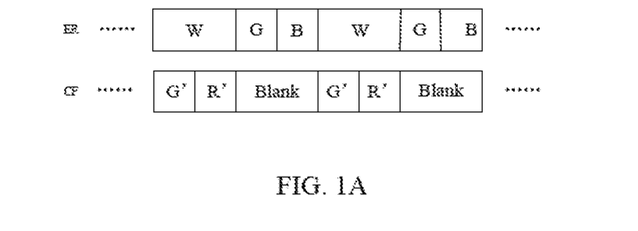
FIG. 1A is a first schematic view of an OLED display panel according to a first embodiment.

FIG. 1A is a schematic view of an OLED display panel according to a first embodiment. Referring to FIG. 1A, the OLED display panel provided in the present embodiment includes a light-emitting layer ER and a color film CF. Wherein the light-emitting layer ER includes white sub-pixels W and color sub-pixels, the size of the white sub-pixel W is equal to the sum of size of at least two color sub-pixels, the number of the color sub-pixels is less than the number of color-forming primary colors, and in the present embodiment, the number of color-forming primary colors is one, red, green and blue, respectively; the color film CF includes color blocks matching the color sub-pixels, the color blocks being disposed on the side of the light-emitting layer ER toward the display side and at positions corresponding to the positions where the white sub-pixels are located. Wherein the color sub-pixels may include red sub-pixel R, green sub-pixel G and blue sub-pixel B. In other words, the color sub-pixels include sub-pixels corresponding to three color-forming primary colors (red, green, and blue). In the embodiment, it is not limited that the color sub-pixels include red sub-pixel R, green sub-pixel G and blue sub-pixel B, while the color sub-pixels may also be sub-pixels of other colors. The so-called color blocks matching the color sub-pixels means that for the same color they both are in the same size, and therefore, the color blocks include red blocks R' having the same size as the red sub-pixels R, green blocks G' having the same size as the green sub-pixels G and blue blocks B' having the same size as the blue sub-pixels B.

To facilitate understanding of the present disclosure, hereinafter, each sub-pixel (including the white sub-pixel W and the color sub-pixels) is set to have the same size in the column direction, and the size of the white sub-pixel W in the row direction is set to be equal to the sum of size of at least two color sub-pixels.

Referring to FIG. 1A, in the present embodiment, specifically, the light-emitting layer ER includes two kinds of color sub-pixels consecutively arranged, and the two kinds of color sub-pixels consecutively arranged are green sub-pixel G and blue sub-pixel B; each row of the light-emitting layer ER is arranged in the way that the white sub-pixel W and the two kinds of color sub-pixels consecutively arranged (G and B) are disposed at intervals; the size of each white sub-pixel W is equal to the sum of size of one green sub-pixel G and one blue sub-pixel B; corresponding to each white sub-pixel W in one row, the color film CF includes two kinds of color blocks, the connected two kinds of color sub-pixels of the light-emitting layer ER are disposed in the row direction in the order of GB, the two kinds of color blocks of the color film CF are disposed in the row direction in the order of G'R', and "blank" in FIG. 1A means that no color blocks are set at the positions of the color film CF corresponding to the color sub-pixels of the light-emitting layer ER.

The work principle in which the OLED display panel provided in the present embodiment achieves displaying is described in detail below in combination with the example in FIG. 1A. Specifically, by controlling the amount of current of blue sub-pixel B (green sub-pixel G) of the light-emitting layer ER, the brightness of blue light (green light) emitted thereby is controlled; and, since the white sub-pixel W corresponds to red block R' and green block G' of the color film CF, brightness of white light emitted toward the red block R' can be controlled by controlling the amount of current of the region of the white sub-pixel W corresponding to the red block R' of the color film CF. Correspondingly, brightness of white light emitted toward the green block G' can be controlled by controlling the amount of current of the region of the white sub-pixel W corresponding to the green block G' of the color film CF. White light of certain brightness transmitting through the red block R' and the green block G' will correspondingly create red light and green light of certain brightness, while the red light, the green light, and the blue light of certain brightness emitted by the blue sub-pixel B adjacent to the white sub-pixel W of the light-emitting layer ER form the color to be displayed by one pixel unit.

It can be seen that, the color sub-pixels of the light-emitting layer ER are a first type of color sub-pixels, the white sub-pixel W of the light-emitting layer ER and the corresponding color blocks form a second type of color sub-pixels and the entire colored pixel displaying is achieved with the first type of color sub-pixels and the second type of color sub-pixels arranged on a display plane of the OLED display panel in a preset arrangement, wherein the preset arrangement is a preset color sub-pixel array. In the present disclosure, the preset arrangement is not limited, as long as it can achieve the displaying.

Specifically, the arrangement in which the color sub-pixels and the color blocks seen from below the color film CF toward the light-emitting layer ER are arranged is the preset arrangement, and in the present embodiment, shown in FIG. 1A, one row in the preset arrangement is disposed cyclically by unit of G'R'GB or GBG'R'.

In summary, since the light-emitting layer ER includes white sub-pixel W, green sub-pixel G and blue sub-pixel B, a mask evaporation process is required three times to evaporate white sub-pixel W, green sub-pixel G and blue sub-pixel B, respectively, and herein the order of evaporating different color sub-pixels is not limited. Since the size of each kind of color sub-pixel of the present disclosure is the same as each kind of color sub-pixel in the prior art, the mask evaporation process for green sub-pixel G and blue sub-pixel B is the same as in the prior art. However, since the size of the white sub-pixel W is equal to the sum of size of the green sub-pixel G and the red sub-pixel R (the sum of size of two color sub-pixels), while the size of a mask aperture corresponds to the size of the evaporated sub-pixels, the size of the aperture of mask for evaporating the white sub-pixel W is the sum of size of the green sub-pixel G and the red sub-pixel R, thereby compared with the prior art, the aperture size of the mask in one evaporation process is increased, whereby the phenomenon that due to a small size the aperture of the mask in the evaporation process is blocked may be improved, reducing the possibility of occurrence of line defects and color mixing on the OLED display panel and improving the quality of the OLED display panel.

In addition, it is found after intensive study of displaying achieved by a conventional light-emitting layer with only white sub-pixel in combination with a color film that its power consumption is large and the color gamut of the OLED display panel is low. The light-emitting layer of the OLED display panel provided in the present disclosure not only includes white sub-pixel, but also includes one or two kinds of color sub-pixels, and can compensate, by means of the one or two kinds of color sub-pixels, for the reduced light intensity and limited color gamut.

Figure 1B:
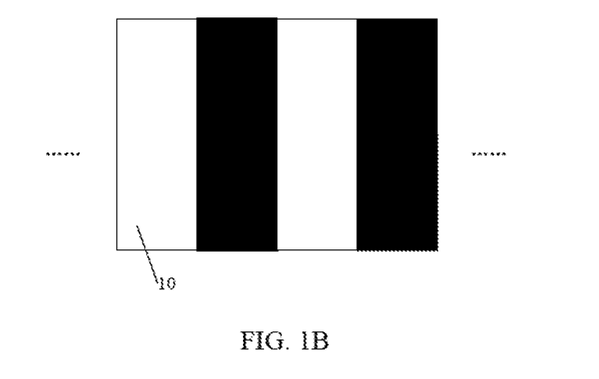
FIG. 1B is a structural schematic view of a mask using a mask evaporation process to evaporate white sub-pixels.
Figure 1C:
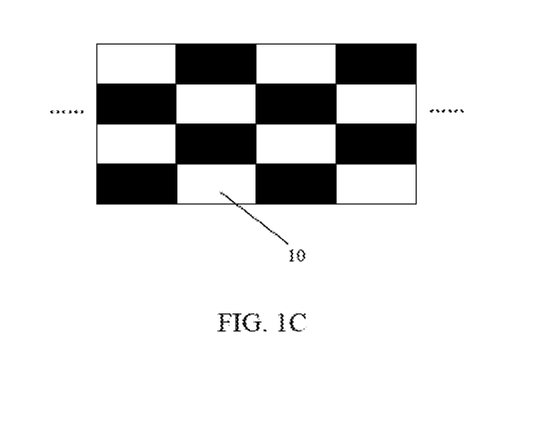
FIG. 1C is another structural schematic view of using a mask evaporation process to evaporate a mask of white sub-pixel.

The white sub-pixels and the same kind of color sub-pixels in neighboring rows of the light-emitting layer ER may correspond to each other one-to-one in position, which makes the white sub-pixel W and each kind of color sub-pixel of the light-emitting layer ER be disposed column by column, and in this case, the length of each white sub-pixel W and color sub-pixel of the light-emitting layer ER is the column length of the sub-pixel array, whereby an aperture 10 of a mask for evaporating white sub-pixel W and each kind of color sub-pixel is in a strip shape (commonly called Slit type), see the mask structure for evaporating the white sub-pixel W shown in FIG. 1B, thereby not only simplifying the structure of the mask and reducing the difficulty of fabricating the light-emitting layer, but also increasing the length of the mask aperture, further reducing the possibility of occurrence of the clogged aperture. Of course, in practice, the white sub-pixels W and the same kind of color sub-pixels in neighboring rows of the light emitting layer ER may not correspond to each other one-to-one in position, and in this case, the aperture 10 of the mask in the mask evaporation process is in a dot shape (commonly called Dot type), see the mask structure for evaporating the white sub-pixel W as shown in FIG. 1C.

Figure 1D:
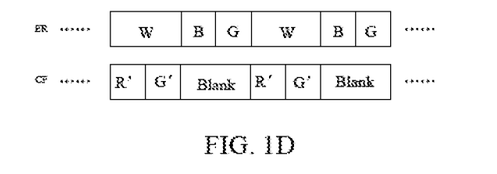
FIG. 1D is a second schematic view of an OLED display panel according to the first embodiment.

It should be noted that, in practice, as shown in FIG. 1D, corresponding to each white sub-pixel W in one row, two kinds of color sub-pixels arranged consecutively of the light-emitting layer ER are disposed in the row direction in the order of BG, then the two kinds of color block of the color film CF are disposed in the row direction in the order of R'G', and in this case, each row in the preset arrangement is disposed cyclically by unit of R'G'BG or BGR'G'.

Figure 1E:
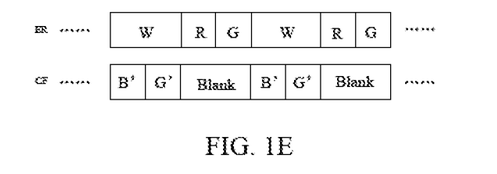
FIG. 1E is a third schematic view of an OLED display panel according to the first embodiment.
Figure 1F:
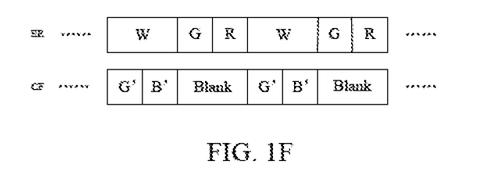
FIG. 1F is a fourth schematic view of an OLED display panel according to the first embodiment.

It should further be noted that, although the two kinds of color sub-pixels connected included in the light-emitting layer ER in the present embodiment are green sub-pixel G and blue sub-pixel B; however, the present disclosure is not limited thereto, and in practical applications, as shown in FIG. 1E and FIG. 1F, the two kinds of color sub-pixels arranged consecutively included in the light-emitting layer ER may also be green sub-pixel G and red sub-pixel R, each row of the light-emitting layer ER is arranged in the way that the white sub-pixels W and the two kinds of color sub-pixels (R and G) arranged consecutively are disposed at intervals, and the size of each white sub-pixel W is equal to the sum of size of one green sub-pixel G and one red sub-pixel R; corresponding to each white sub-pixel W in one row, the color film CF includes two kinds of color blocks, the two connected color sub-pixels of the light-emitting layer ER are disposed in the row direction in the order of RG, and the two kinds of color sub-pixels of the color film are disposed in the row direction in the order of B'G', and as shown in FIG. 1E, in this case, one row in the preset arrangement is disposed cyclically by unit of RGB'G' or B'G'RG; the two kinds of color sub-pixels arranged consecutively of the light-emitting layer ER are disposed in the row direction in the order of GR, and the two kinds of color sub-pixels of the color film are disposed in the row direction in the order of GB', and as shown in FIG. 1F, in this case, one row in the preset arrangement is disposed cyclically by unit of GRG'B' or G'B'GR.

It needs to be further noted that, in this embodiment, each row in the preset arrangement is disposed cyclically by unit of GRG'B' or G'B'GR or RGB'G' or B'G'RG or G'R'GB or GBG'R' or R'G'BG or BGR'G', that is, the preset arrangement is a Pentile arrangement, which may reduce the number of sub-pixels disposed in a way that neighboring pixels share sub-pixels, thereby improving process costs.

Figure 2A:
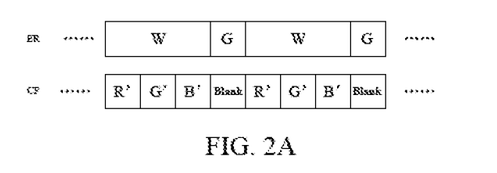
FIG. 2A is a first schematic view of an OLED display panel according to a second embodiment.
Figure 2B:
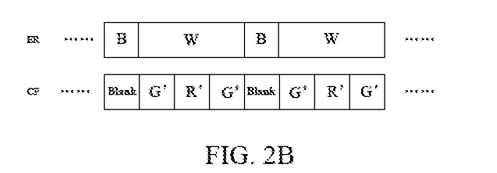
FIG. 2B is a second schematic view of an OLED display panel according to the second embodiment.
Figure 2C:
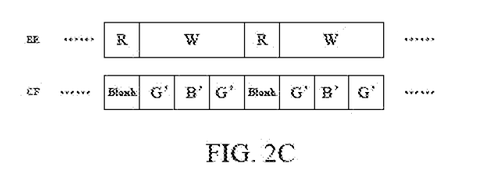
FIG. 2C is a third schematic view of an OLED display panel according to the second embodiment.

FIG. 2A is a first schematic view of an OLED display panel according to a second embodiment; FIG. 2B is a second schematic view of an OLED display panel according to the second embodiment; and FIG. 2C is a third schematic view of an OLED display panel according to the second embodiment. Referring to FIGS. 2A-2C together, the OLED display panel provided in the present embodiment is similar to the OLED display panel provided in the first embodiment and also includes a light-emitting layer ER and a color film CF. The structures and functions of the light-emitting layer ER and color film CF as well as the work principle by which the both cooperate to realize the displaying will not be described here, since they have been described in detail in the above first embodiment.

Hereinafter, only the distinctive points between the present embodiment and the first embodiment are described in detail. Specifically, as shown in FIG. 2A, the light-emitting layer ER includes one kind of color sub-pixel, and the one kind of color sub-pixel is the green sub-pixel G; each row of the light-emitting layer ER is arranged in a way that white sub-pixels W and green sub-pixels G are disposed at intervals; the size of each white sub-pixel W is equal to the sum of size of one red sub-pixel R, one green sub-pixel G and one blue sub-pixel B; corresponding to each white sub-pixel W in one row, the color film CF includes three kinds of color blocks, and the three kinds of color blocks are disposed in the row direction in the order of R'G'B'(B'G'R'). In this case, each row in a preset arrangement is disposed cyclically by unit of GR'G'B' or R'G'B'G (B'G'R'G or B'G'R'G), and is also a Pentile arrangement.

As shown in FIG. 2B, the one kind of color sub-pixel included in the light-emitting layer ER is the blue sub-pixel, and each row of the light-emitting layer ER is arranged in a way that white sub-pixel W and blue sub-pixel B are disposed at intervals; the size of each white sub-pixel W is equal to the sum of size of two green sub-pixels G and one red sub-pixel R; corresponding to each white sub-pixel W in one row, the color film CF includes two kinds of color blocks, and the two kinds of color blocks are disposed in the row direction in the order of G'R'G'. In this case, each row in a preset arrangement is disposed cyclically by unit of BG'R'G' or G'R'G'B, and is also a Pentile arrangement.

As shown in FIG. 2C, the one kind of color sub-pixel included in the light-emitting layer ER is the red sub-pixel R, and each row of the light-emitting layer ER is arranged in a way that white sub-pixels W and red sub-pixels R are disposed at intervals; the size of each white sub-pixel W is equal to the sum of size of two green sub-pixels G and one blue sub-pixel B; corresponding to each white sub-pixel W in one row, the color film CF includes two kinds of color blocks, and the two kinds of color blocks are disposed in the row direction in the order of GBG. In this case, each row in a preset arrangement is disposed cyclically by unit of G'B'G'R' or RG'B'G', and is also a Pentile arrangement.

In the present embodiment, as shown in FIG. 2A to 2C, since the light-emitting layer ER includes a white sub-pixel W and one kink of color sub-pixel (G, R, or B), the mask evaporation process is required only twice to evaporate the white sub-pixel W and the one kind of color sub-pixel respectively, and herein there is no limitation on the order of evaporating different color sub-pixels.

Figure 2D:
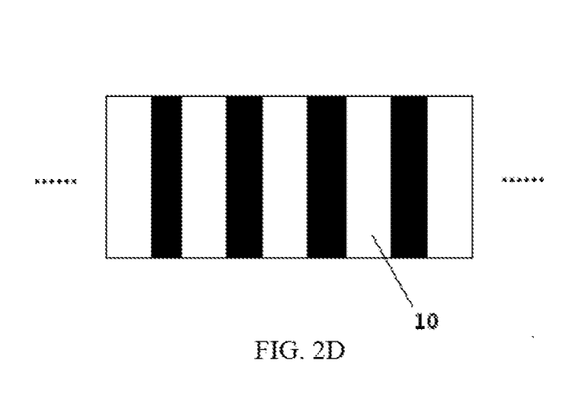
FIG. 2D is a first structural schematic view of using a mask evaporation process to evaporate a mask of white sub-pixel.
Figure 2E:
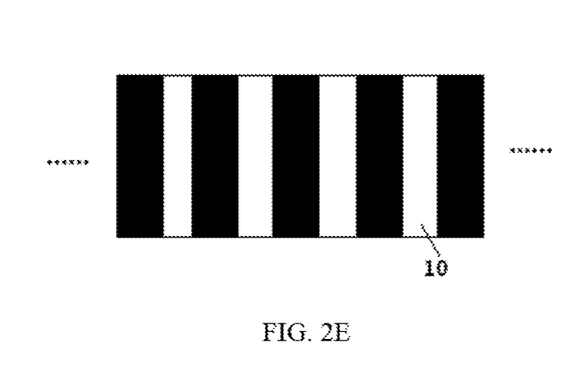
FIG. 2E is a first structural schematic view of using a mask evaporation process to evaporate a mask of one kind of color sub-pixel of a light-emitting layer.

The white sub-pixel W and the same color sub-pixel in neighboring rows of the light-emitting layer ER may correspond to each other one-to-one in position. In this case, similar to the first embodiment above-described, the shapes of the aperture 10 of the mask in the two mask evaporation processes are of strip (i.e., Slit type), and are shown in FIG. 2E and FIG. 2D, respectively, wherein, FIG. 2D is the structure of the mask for evaporating the white sub-pixel W, and FIG. 2E is the structure of the mask for evaporating the one kind of color sub-pixel of the light-emitting layer.

Figure 2F:
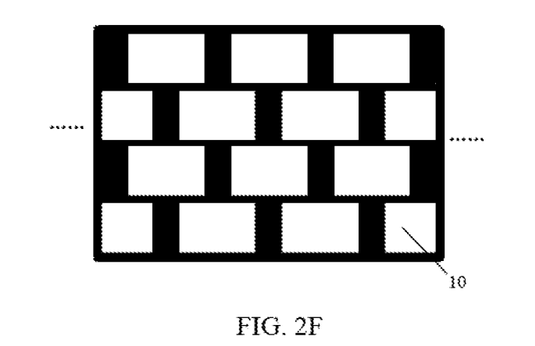
FIG. 2F is a second structural schematic view of using a mask evaporation process to evaporate a mask of white sub-pixel.
Figure 2G:
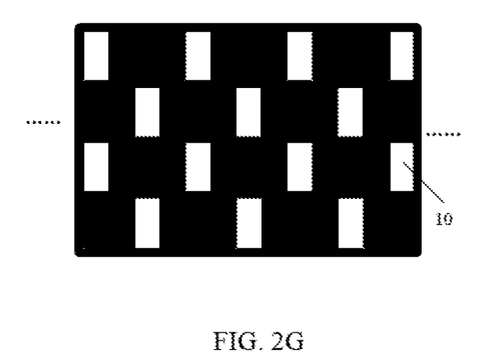
FIG. 2G is a second structural schematic view of using a mask evaporation process to evaporate a mask of one kind of color sub-pixel of a light-emitting layer.

Of course, in practical applications, if the white sub-pixel W and the same color sub-pixel in neighboring rows of the light-emitting layer ER do not correspond to each other one-to-one in position, the shapes of the aperture 10 of the mask in the two mask evaporation processes are of dot (i.e., Dot type), and are shown in FIG. 2F and FIG. 2G, respectively. FIG. 2F is the structure of the mask for evaporating the white sub-pixel W, and FIG. 2G is the structure of the mask for evaporating one kind of color sub-pixel of the light-emitting layer.

In summary, for the OLED display panel provided in the present embodiment, compared with the OLED display panel provided in the first embodiment described above and in the prior art, not only the mask evaporation process can be reduced once to decrease the risk of color mixing caused by the misalignment of the mask in the mask evaporation processes, but also because the size of the white sub-pixel W is equal to the sum of size of three kinds of color sub-pixels (R, G and B), the size of the aperture 10 of the mask for evaporating the white sub-pixel W is further increased, compared with the first embodiment, to further improve the apertures being clogged due to its small size in the evaporation process, and yet further decrease the likelihood of occurrence of line defects and color mixing on the OLED display panel without affecting the resolution.

Further, the OLED display panels provided in FIGS. 2A-2C in the present embodiment are compared with each other. Specifically, there are the following differences between the three: first, the color film CF shown in FIGS. 2B and 2C includes two kinds of color blocks only, and compared with the color film CF shown in FIG. 2A including three kinds of color blocks, the attaching step for each kind of color block of the color film may be reduced, thereby simplifying the process and increasing production; second, because the size of red and blue sub-pixel in the Pentile arrangement is generally one to two times the size of green sub-pixel, the size of aperture 10 of mask for fabrication of color sub-pixels of the light-emitting layer in FIGS. 2B and 2C is one to two times the size of aperture 10 of mask for fabrication of color sub-pixels of the light-emitting layer in FIG. 2A, whereby the OLED display panel shown in FIGS. 2B and 2C, compared with the OLED display panel in FIG. 2A, may further reduce the possibility of occurrence of line defects and color mixing on the OLED display panel.

It is noteworthy that the preset arrangements in the above first embodiment and the second embodiment are both Pentile arrangement; however, the present disclosure is not limited thereto, and in practice, the arrangement can also employ other arrangement, which is not listed herein. Further, in practice, the number of white sub-pixel may be one or more, and it is ok whether or not the sizes of plurality of white sub-pixels are equal.

Embodiments of the present disclosure further provide an OLED display apparatus including an OLED display panel which adopts an OLED display panel provided in the first embodiment and second embodiment.

Specifically, the display apparatus can be: a mobile phone, a tablet computer, a television, a display, a notebook computer, a digital picture frame, a navigator and any other product or component having a display function.

The OLED display apparatus provided in the embodiment adopts the OLED display panel in the above-described first embodiment and second embodiment, not only can improve the quality of OLED display panels, but also can improve production, thereby increasing economic benefits.

Embodiments of the present disclosure further provide a method for fabricating an OLED display panel, for the fabrication of the OLED display panel provided in the above-described embodiment, the method including at least the following steps:

fabricating one of a light-emitting layer and a color film, wherein the light-emitting layer includes color sub-pixel and white sub-pixel, the size of the white sub-pixel is equal to the sum of size of at least two color sub-pixels, and the number of the color sub-pixels is less than the number of color-forming primary colors; the color film including color blocks matching the color sub-pixels. Specifically, the color sub-pixels include red sub-pixels, green sub-pixels, and blue sub-pixels, in other words, the color sub-pixels include sub-pixels corresponding to the color-forming primary colors (red, green, and blue); the so-called color blocks matching the color sub-pixels means that the both comprise the same color and each color corresponds to the same size, whereby the color blocks include red blocks having the same size as the red sub-pixels, green blocks having the same size as the green sub-pixels and blue blocks having the same size as the blue sub-pixels. Of course, it is not limited that the color sub-pixels include red sub-pixel R, green sub-pixel G and blue sub-pixel B, and also may include sub-pixels of other colors.

According to the one of the light-emitting layer and the color film fabricated in advance and according to a corresponding position relationship between the color blocks and the white sub-pixels, the other of the light-emitting layer and the color film is fabricated, the color film is deposited on one side toward the display side and the light-emitting layer is deposited on one side back toward the display side.

As can be seen, the method for fabricating the OLED display panel according to the embodiment of the present disclosure not only may first fabricate the light-emitting layer and then fabricate the above color film, but also may first fabricate the color film and then fabricate the light-emitting layer. That is, the embodiment of the present disclosure does not limit the order of fabrication of the light-emitting layer and color film.

In the present embodiment, the mask evaporation process is used to evaporate the white sub-pixel and color sub-pixel of the light emitting layer. Further, the mask of the mask evaporation process adopts a striped mask pattern or a dotted mask mask pattern, and the masks using the striped mask pattern are shown in FIG. 1B, FIG. 2D and FIG. 2E, and the masks using the dotted mask pattern are shown in FIG. 1C, FIG. 2F and FIG. 2G.

The fabrication method using this OLED display panel may fabricate the OLED display panel provided in the first embodiment and second embodiment, while the work principle in which it achieves the displaying has been described in detail in the embodiments abovementioned and will not be described any more.

In sum, since fabricating the white sub-pixel having the size which is equal to the sum of size of at least two color sub-pixels requires that the size of aperture of mask in the mask evaporation process is correspondingly the sum of size of at least two color sub-pixels, and this, compared with the requirement in the prior art that the size of aperture of the mask is merely the size of one color sub-pixel, may improve the aperture of mask in the mask evaporation process being clogged, thereby reducing the possibility of occurrence of line defects and color mixing on the OLED display panel and improving the quality of the OLED display panel; in addition, the fabrication of the light-emitting layer including one kind of color sub-pixels and the white sub-pixel only requires the mask evaporation process twice, and this, compared with the prior art merely requiring the mask evaporation process three times may reduce the mask evaporation process once, thereby not only increasing productivity and improving economic benefits, but also reducing the risk of color mixing caused by the misalignment of the mask aperture in the mask evaporation process and improving the quality of the OLED display panel.

It may be appreciated that the above embodiments are merely exemplary embodiments used to illustrate the principles of the present disclosure but the present disclosure is not limited thereto. Those of ordinary skill in the art may make variant modifications and improvements, without departing from the spirit and essence of the present disclosure, while these modifications and improvements are also considered within the scope of the present disclosure.

What is claimed is:

1. An OLED display panel, including a light-emitting layer, wherein:
   the light-emitting layer comprises white sub-pixels and color sub-pixels, a size of each white sub-pixel is equal to a sum of sizes of at least two of the color sub-pixels, and a number of the color sub-pixels is less than a number of color-forming primary colors; and
   the OLED display panel further comprises a color film, the color film comprising color blocks matching the color sub-pixels, the color blocks being disposed on a side of the light-emitting layer toward a display side and at positions corresponding to positions of the white sub-pixels.

2. The OLED display panel according to claim 1, wherein:
   the color sub-pixels comprise red sub-pixels, green sub-pixels, and blue sub-pixels;
   the light-emitting layer comprises one kind of color sub-pixel of the color sub-pixels, and the one kind of color sub-pixel is the green sub-pixels;
   each row of the light-emitting layer is arranged such that the white sub-pixels and the green sub-pixels are disposed at intervals;
   the size of each of the white sub-pixels is equal to a sum of sizes of one of the red sub-pixels, one of the green sub-pixels, and one of the blue sub-pixels; and
   the color film comprises three kinds of the color blocks corresponding to each of the white sub-pixels in one row, and the color blocks are disposed in a row direction in the order of i) red block, green block, and blue block, or ii) blue block, green block, and red block.

3. The OLED display panel according to claim 1:
   the color sub-pixels comprise red sub-pixels, green sub-pixels, and blue sub-pixels;
   the light-emitting layer comprises one kind of color sub-pixel of the color sub-pixels, and the one kind of color sub-pixel is the blue sub-pixels;
   each row of the light-emitting layer is arranged such that the white sub-pixels and the blue sub-pixels are disposed at intervals;
   the size of each of the white sub-pixels is equal to a sum of sizes of two of the green sub-pixels and one of the red sub-pixels; and
   the color film comprises two kinds of the color blocks corresponding to each of the white sub-pixels in one row, and the color blocks are disposed in a row direction in the order of green block, red block, and green block.

4. The OLED display panel according to claim 1, wherein:
   the color sub-pixels comprise red sub-pixels, green sub-pixels, and blue sub-pixels;
   the light-emitting layer comprises one kind of color sub-pixel of the color sub-pixels, and the one kind of color sub-pixel is the red sub-pixels;
   each row of the light-emitting layer is arranged such that the white sub-pixels and the red sub-pixels are disposed at intervals;
   the size of each of the white sub-pixels is equal to a sum of sizes of two of the green sub-pixels and one of the blue sub-pixels; and
   the color film comprises two kinds of the color blocks corresponding to each of the white sub-pixels in one row, and the color blocks are disposed in a row direction in the order of green block, blue block, and green block.

5. The OLED display panel according to claim 1, wherein:
   the color sub-pixels comprise red sub-pixels, green sub-pixels, and blue sub-pixels;
   the light-emitting layer comprises two kinds of color sub-pixel of the color sub-pixels, and the two kinds of color sub-pixel are arranged consecutively and are the green sub-pixels and the blue sub-pixels;
   each row of the light-emitting layer is arranged such that the white sub-pixels and the two kinds of color sub-pixels arranged consecutively are disposed at intervals;
   the size of each of the white sub-pixels is equal to a sum of sizes of one of the green sub-pixels and one of the blue sub-pixels; and
   the color film comprises two kinds of the color blocks corresponding to each of the white sub-pixels in one row, and i) if the two kinds of color sub-pixels arranged consecutively are disposed in a row direction in the order of blue sub-pixel and green sub-pixel, the two kinds of the color blocks are disposed in the row direction in the order of red block and green block, and ii) if the two kinds of color sub-pixels arranged consecutively are disposed in the row direction in the order of green block and blue block, the two kinds of the color blocks are disposed in the row direction in the order of green block and red block.

6. The OLED display panel according to claim 1, wherein:
   the color sub-pixels comprise red sub-pixels, green sub-pixels, and blue sub-pixels;
   the light-emitting layer comprises two kinds of color sub-pixel of the color sub-pixels, and the two kinds of color sub-pixel are arranged consecutively and are the green sub-pixels and the red sub-pixels;

each row of the light-emitting layer is arranged such that the white sub-pixels and the two kinds of color sub-pixels arranged consecutively are disposed at intervals;

the size of each of the white sub-pixels is equal to a sum of sizes of one of the green sub-pixels and one of the red sub-pixels; and the color film comprises two kinds of the color blocks corresponding to each of the white sub-pixels in one row, and i) if the two kinds of color sub-pixels arranged consecutively are disposed in a row direction in the order of red sub-pixel and green sub-pixel, the two kinds of the color blocks are disposed in the row direction in the order of blue block and green block, and ii) if the two kinds of color sub-pixels arranged consecutively are disposed in the row direction in the order of green block and red block, the two kinds of the color blocks are disposed in the row direction in the order of green block and blue block.

7. The OLED display panel according claim 1, wherein the white sub-pixels and the same kind of the color sub-pixels in neighboring rows of the light-emitting layer correspond to each other one-to-one in position.

8. An OLED display apparatus including an OLED display panel, wherein the display panel employs the OLED display panel according to claim 1.

9. A method for fabricating an OLED display panel, wherein the method comprises:

fabricating one of a light-emitting layer and a color film, wherein the light-emitting layer includes color sub-pixels and white sub-pixels, wherein a size of each white sub-pixel is equal to a sum of sizes of at least two color sub-pixels, and wherein a number of the color sub-pixels is less than a number of color-forming primary colors, and wherein the color film includes color blocks matching the color sub-pixels;

according to the one of the light-emitting layer and the color film fabricated in advance and according to a corresponding position relationship between the color blocks and the white sub-pixels, fabricating the other of the light-emitting layer and the color film and depositing the color film on a side toward a display side and the light-emitting layer on a side opposite the display side.

10. The method for fabricating an OLED display panel according to claim 9, further comprising using a mask evaporation process to evaporate the white sub-pixels and the color sub-pixels of the light-emitting layer.

11. The method for fabricating an OLED display panel according to claim 10, wherein a mask in the mask evaporation process adopts one of a striped mask pattern and a dotted mask pattern.

12. The OLED display panel according to claim 2, wherein the white sub-pixels and the same kind of the color sub-pixels in neighboring rows of the light-emitting layer correspond to each other one-to-one in position.

13. The OLED display panel according to claim 3, wherein the white sub-pixels and the same kind of the color sub-pixels in neighboring rows of the light-emitting layer correspond to each other one-to-one in position.

14. The OLED display panel according to claim 4, wherein the white sub-pixels and the same kind of the color sub-pixels in neighboring rows of the light-emitting layer correspond to each other one-to-one in position.

15. The OLED display panel according to claim 5, wherein the white sub-pixels and the same kind of the color sub-pixels in neighboring rows of the light-emitting layer correspond to each other one-to-one in position.

16. The OLED display panel according to claim 6, wherein the white sub-pixels and the same kind of the color sub-pixels in neighboring rows of the light-emitting layer correspond to each other one-to-one in position.

* * * * *